United States Patent
Weng et al.

(10) Patent No.: US 9,472,690 B2
(45) Date of Patent: Oct. 18, 2016

(54) DEEP TRENCH CAPACITOR MANUFACTURED BY STREAMLINED PROCESS

(71) Applicant: Taiwan Semiconductor Manufacturing Co., Ltd., Hsin-Chu (TW)

(72) Inventors: Wu-An Weng, Hsinchu (TW); Chen-Chien Chang, Zhubei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 14/318,870

(22) Filed: Jun. 30, 2014

(65) Prior Publication Data
US 2014/0327109 A1 Nov. 6, 2014

Related U.S. Application Data

(63) Continuation-in-part of application No. 13/666,193, filed on Nov. 1, 2012, now Pat. No. 8,853,048.

(51) Int. Cl.
| | | |
|---|---|---|
| *H01L 29/94* | (2006.01) | |
| *H01L 29/66* | (2006.01) | |
| *H01L 23/00* | (2006.01) | |

(52) U.S. Cl.
CPC ....... *H01L 29/945* (2013.01); *H01L 29/66181* (2013.01); *H01L 24/08* (2013.01); *H01L 24/94* (2013.01); *H01L 2224/08146* (2013.01); *H01L 2224/94* (2013.01); *H01L 2924/1436* (2013.01)

(58) Field of Classification Search
None
See application file for complete search history.

(56) References Cited

U.S. PATENT DOCUMENTS

| | | | |
|---|---|---|---|
| 5,466,628 A * | 11/1995 | Lee ................... | H01L 27/10861 257/E21.651 |
| 5,963,841 A | 10/1999 | Karlsson et al. | |
| 2002/0008267 A1 | 1/2002 | Weijand et al. | |
| 2005/0164469 A1 | 7/2005 | Haupt | |
| 2007/0015327 A1 | 1/2007 | Su | |
| 2010/0181645 A1* | 7/2010 | Marenco ............. | H01L 27/0694 257/532 |
| 2012/0061798 A1* | 3/2012 | Wong ................ | H01L 27/10861 257/532 |

OTHER PUBLICATIONS

U.S. Appl. No. 13/666,193, filed Nov. 1, 2012.
Non-Final Office Action dated Oct. 28, 2013 for U.S. Appl. No. 13/666,193.
Notice of Allowance dated Jun. 6, 2014 for U.S. Appl. No. 13/666,193.

* cited by examiner

*Primary Examiner* — Mary Wilczewski
*Assistant Examiner* — Erik T Peterson
(74) *Attorney, Agent, or Firm* — Eschweiler & Associates, LLC

(57) ABSTRACT

The present disclosure provides a deep trench capacitor device. A first capacitor electrode is made up of a doped region of semiconductor substrate in which two or more trenches are arranged. A second capacitor electrode is made up of a continuous body of conductive material. The continuous body of conductive material includes a lower body portion filling the two or more trenches and an upper body portion extending continuously over the lower body portion. The upper body portion extends upwardly out of the trenches by a non-zero distance. A capacitor dielectric liner is arranged in the two or more trenches to separate the first and second capacitor electrodes. The capacitor dielectric liner extends continuously out of the two or more trenches along outer sidewalls of the upper body portion.

19 Claims, 18 Drawing Sheets

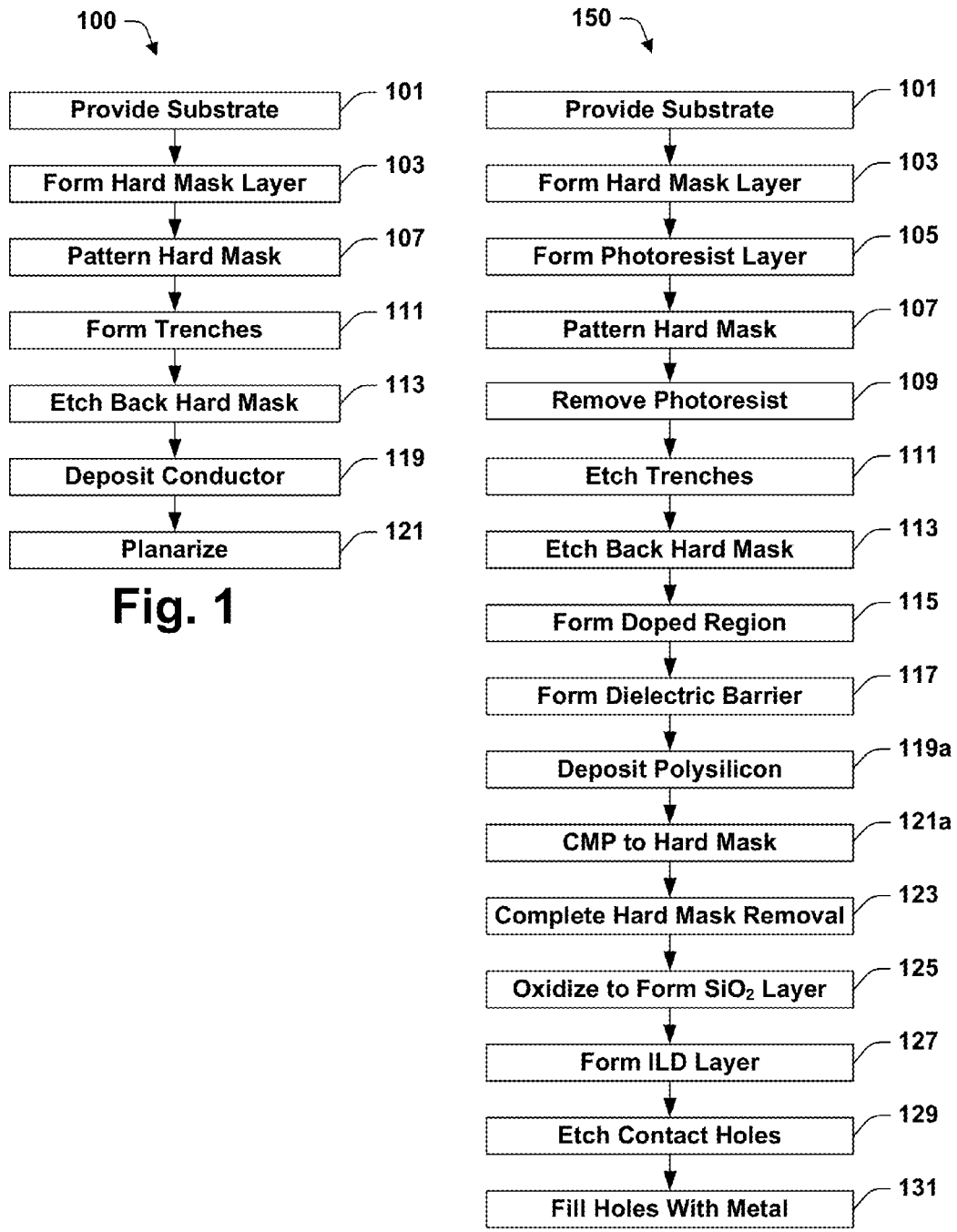

DEEP TRENCH CAPACITOR MANUFACTURED BY STREAMLINED PROCESS

RELATED APPLICATIONS

This application is a continuation-in-part of application Ser. No. 13/666,193, which was filed on Nov. 1, 2012, and the contents of which are incorporated herein in their entirety. This application hereby claims priority to application Ser. No. 13/666,193 (the parent application).

Further, the present continuation-in-part application provides clarification on some points of the parent application as well as new matter. It will be appreciated that many of these points of clarification in the present application had broad support in the parent application, and are merely defined at a greater level of in this continuation-in-part application.

FIELD

The present disclosure relates to integrated circuits and semiconductor device fabrication. In particular, the disclosure relates to processes of forming vertically structured devices such as deep trench capacitors, as well as corresponding devices structures.

BACKGROUND

The semiconductor industry has long been interested in vertical device structures. Vertical device structures can greatly reduce the surface area requirement for a semiconductor device. Deep trench capacitors are one type of vertical device that has received attention. Deep trench capacitors can be used in various capacities, most notably in forming dynamic random access memory (DRAM).

Semiconductor devices fabrication requires a very large number of process operations and process controls. The number of steps and their complexity contributes significantly to manufacturing cost. Accordingly, there has been a long felt need for new semiconductor device manufacturing processes that require fewer steps and less queue time, that are easier to control and are more reliable, or both.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1 provides an exemplary process of the present disclosure according to one or more embodiments.

FIG. 2 provides an example of a process of FIG. 1 according to one or more embodiments.

In general, FIGS. 3-14 show a series of cross-sectional views that collectively illustrate a manufacturing process in accordance with some embodiments.

More particularly, FIG. 3 illustrates an exemplary substrate with hard mask and resist layers formed thereon according to one or more embodiments.

FIG. 4 illustrates the structure of FIG. 3 following patterning of the resist layer according to one or more embodiments.

FIG. 5 illustrates the structure of FIG. 4 following patterning of the hard mask layer and removal of the resist layer according to one or more embodiments.

FIG. 6 illustrates the structure of FIG. 5 following etching to form trenches according to one or more embodiments.

FIG. 7 illustrates the structure of FIG. 6 after etching back the hard mask according to one or more embodiments.

FIG. 9 illustrates the structure of FIG. 8 following formation of a dielectric barrier according to one or more embodiments.

FIG. 10 illustrates the structure of FIG. 9 following deposition of conductive material according to one or more embodiments.

FIG. 11 illustrates the structure of FIG. 10 following planarization according to one or more embodiments.

FIG. 12 illustrates the structure of FIG. 11 following removal of the remaining portion of the hard mask layer according to one or more embodiments.

FIG. 13 illustrates the structure of FIG. 12 following formation of an oxide layer according to one or more embodiments.

FIG. 14 illustrates the structure of FIG. 13 following formation of a contact layer according to one or more embodiments.

In general.

DETAILED DESCRIPTION

Figure 3:

The following disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is flow chart of a process 100 according to one or more embodiments of the present disclosure. FIG. 2 is a flow chart of a process 150 according to one or more embodiments, which is an example of the process 100 with additional details applicable to forming a deep trench capacitor. FIGS. 3 through 14 illustrate a substrate 200 as it progresses through the process 150 according to one or more embodiments.

Figure 4:
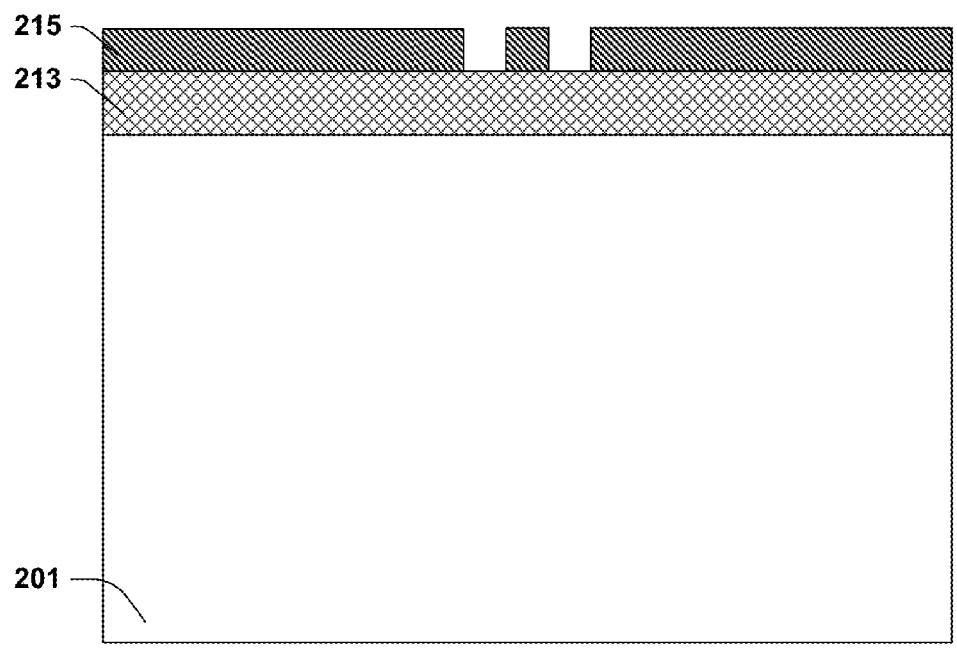
Figure 5:
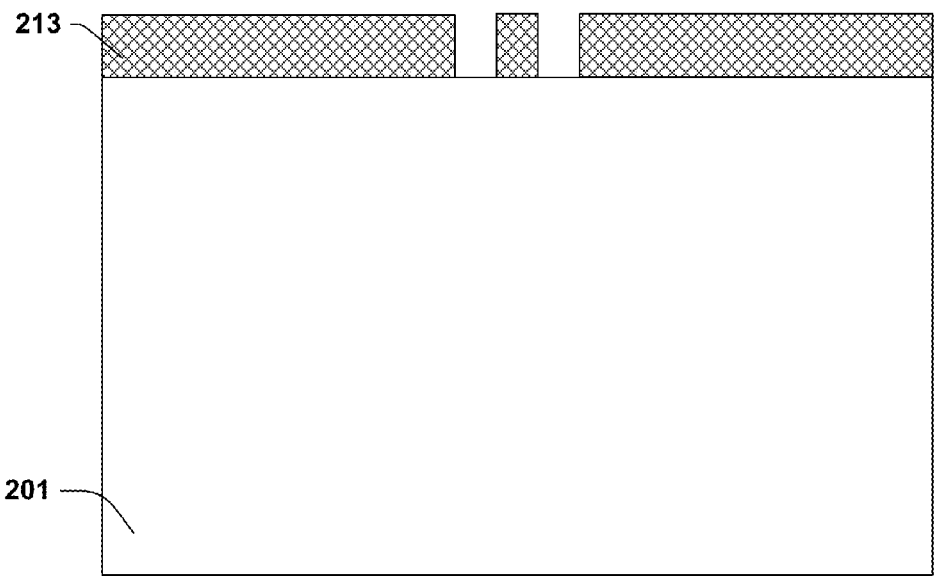
Figure 6:
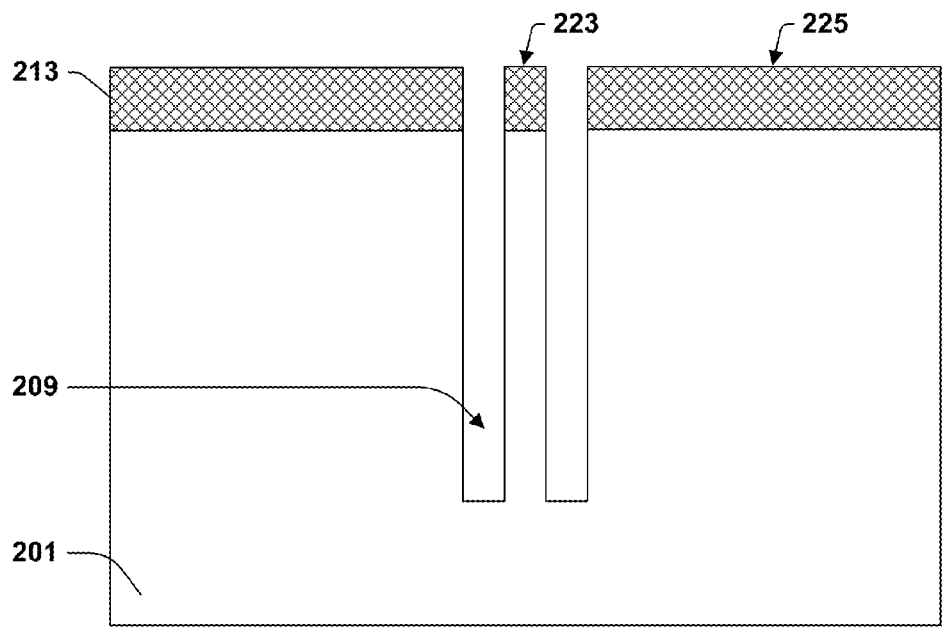

Operation 101 is providing a semiconductor substrate, such as semiconductor substrate 200 shown in FIG. 3. The substrate 200 includes a semiconductor 201 and is a semiconductor device at an intermediate stage of manufacture. Examples of semiconductors include, without limitation, silicon, silicon on insulator (SOI), Ge, SiC, GaAs, GaAlAs, InP, GaN, and SiGe. As shown in FIGS. 4-6, for example, the process 100 forms closely spaced parallel trenches 209 in the semiconductor 201, fills the trenches 209 with conductor 207 (see e.g., FIG. 10), and also forms a conductive bridge 224 (see e.g., FIG. 11), which can be a contact plate, across the trenches 209. The semiconductor 201 can include regions, structures, and devices that are not illustrated by the Figures and are formed by one or more operations that can take place before, overlapping with, or after the operations of the process 100.

Operation 103 is forming a hard mask layer over the substrate 200, such as hard mask 213 shown in FIG. 3. Hard mask layer 213 can include one or more layers. Any suitable material or combination of materials can be used. A typical hard mask material is silicon dioxide. Examples of other materials that may be suitable for the hard mask layer 213 include without limitation, silicon nitride and SiON. The hard mask layer 213 can be formed by any suitable process or combination of processes. Operation 105 in FIG. 2 is forming a photoresist layer 215 over the hard mask layer 213 to provide a structure such as the one illustrated by FIG. 3 according to one or more embodiments.

Operation 107 is patterning the hard mask layer 213. Patterning forms openings in the hard mask layer 213 where trenches 209 are desired. Patterning can be accomplished by any suitable process. A suitable process typically includes photolithography. The photoresist 215 is selectively exposed according to the desired pattern and developed to provide a structure as illustrated by FIG. 4 according to one or more embodiments. The patterned photoresist 215 is then used as a mask to etch the hard mask layer 213 and transfer the trench pattern from the photoresist 215 to the hard mask layer 213. The photoresist can then be stripped (operation 109 in FIG. 2) to provide the structure illustrated by FIG. 5 according to one or more embodiments.

Operation 111 is forming trenches 209 by etching the semiconductor 201 using the patterned hard mask layer 213 as a mask. FIG. 6 illustrates the resulting structure according to one or more embodiments. Any suitable etch process can be used. A suitable etch process is typically a plasma etch. Trenches 209 can have a high aspect ratio. A high aspect ratio is a depth to width ratio of 10:1 or more in one embodiment. When process 100 is applied to form structures for deep trench capacitors or similar devices, aspect ratios may vary from 20:1 to 50:1 in one embodiment. Typical depths may vary from 500 nm to 10,000 nm in one embodiment. The widths of trenches 209 may vary from about 28 nm to 500 nm in one embodiment. Widths may vary from 50 nm to 200 nm in another embodiment.

Trenches 209 can comprise a large number of evenly spaced parallel trenches. A large number can be a number greater than 10 in one embodiment or greater than 100 in another embodiment. Adjacent pairs of trenches 209 are considered parallel if the distance between trenches remains approximately constant over a length/depth of the trenches that is one or more orders of magnitude greater than the trench widths. Parallelism and adjacency occur over a region of the substrate 200 that can be limited. Accordingly, parallel and adjacent trenches 209 can vary in their lengths and can have structures that vary at their ends outside the region of parallelism.

Figure 7:
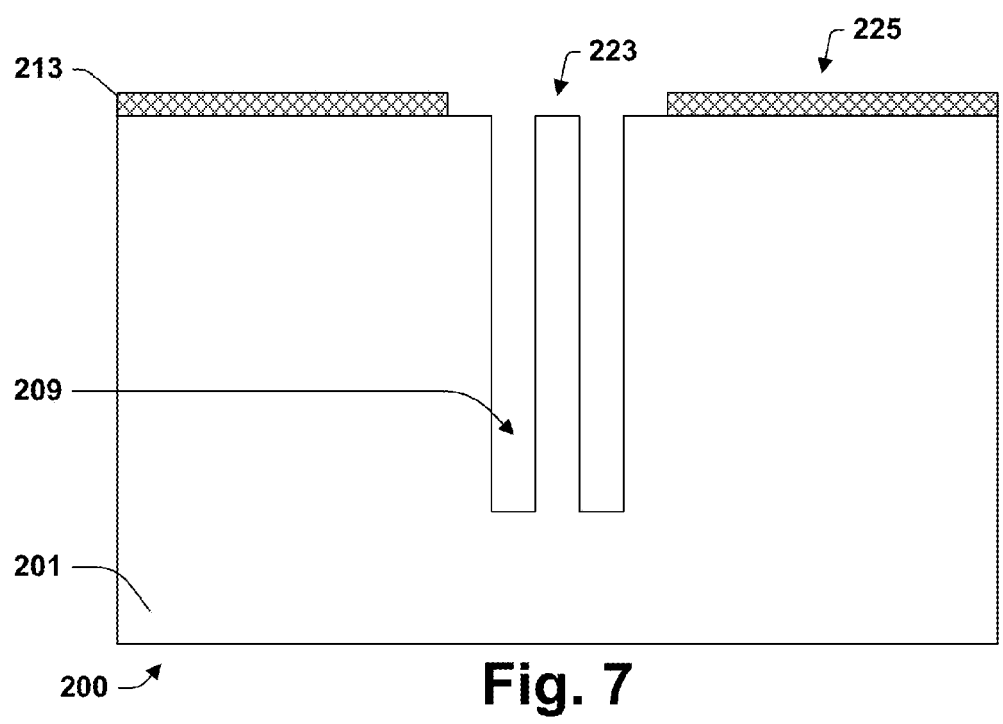

Operation 113 is an etch back process that partially removes the hard mask 213, as illustrated in FIG. 7 according to one or more embodiments. The etch back process removes the hard mask layer 213 from locations 223, which are locations between adjacent trenches 209, to a greater extent than from location 225, which are away from trenches 209. In particular, operation 113 causes the surface of the hard mask layer 213 to retreat at location 223 to a greater extent than at locations 225. Operation 113 reduces the hard mask layer 213 thickness at locations 215 to half or less than its original thickness. Operation 113 can remove the hard mask layer 213 completely from locations 223 while leaving the hard mask layer 213 as a coating over locations 225. By removing the hard mask layer 213 from some locations 223, openings in the resultant hard mask layer 213 corresponding to trenches 209 can become united by operation 213, thereby changing the pattern of the hard mask layer 213 and reducing the number of openings through that layer. FIG. 7 illustrates a structure resulting from operation 113 according to one or more embodiments.

Preferential etching at location 223 can be achieved by using a lateral or isotropic etch process that takes advantage of the greater ratio of exposed surface to volume of the hard mask layer 213 at locations 223 as compared to the hard mask layer 213 at locations 225. A typical process for operation 113 is a wet etch. The surface to volume ratio of the hard mask layer 213 at locations 223 relates to the thickness of the hard mask layer 213 in comparison to the spacing of the trenches 209. Preferential etching at location 223 is enhanced when the trenches 209 are closely spaced. The spacing is typically in the range from 30 nm to 200 nm, and is generally less than 100 nm. The thickness of the hard mask layer 213 prior to operation 113, is generally greater than or equal to half the spacing of trenches 209, for example, 100 nm, in one embodiment. Typically, the thickness is greater than or equal to the spacing of trench 209, and can be 2 or more times greater to facilitate selective removal of the hard mask layer 213 from locations 223. By changing the pattern of hard mask layer 213 as shown for example in FIGS. 6-7, operation 113 effectively realizes two different patterns through the use of a single photo mask (used to pattern photoresist 215 in FIG. 4). Thus, compared to previous approaches where two separate photo masks would be used to realize these two different patterns, the present approach eliminates a photomask and therefore reduces manufacturing costs.

Figure 8A:
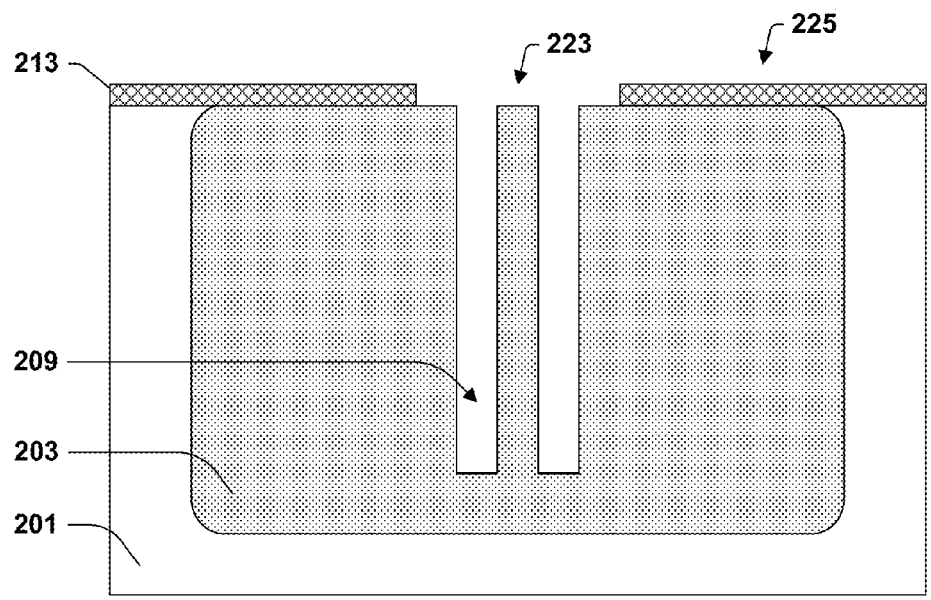
FIG. 8A illustrates the structure of FIG. 7 after implantation doping according to one or more embodiments.
Figure 8B:
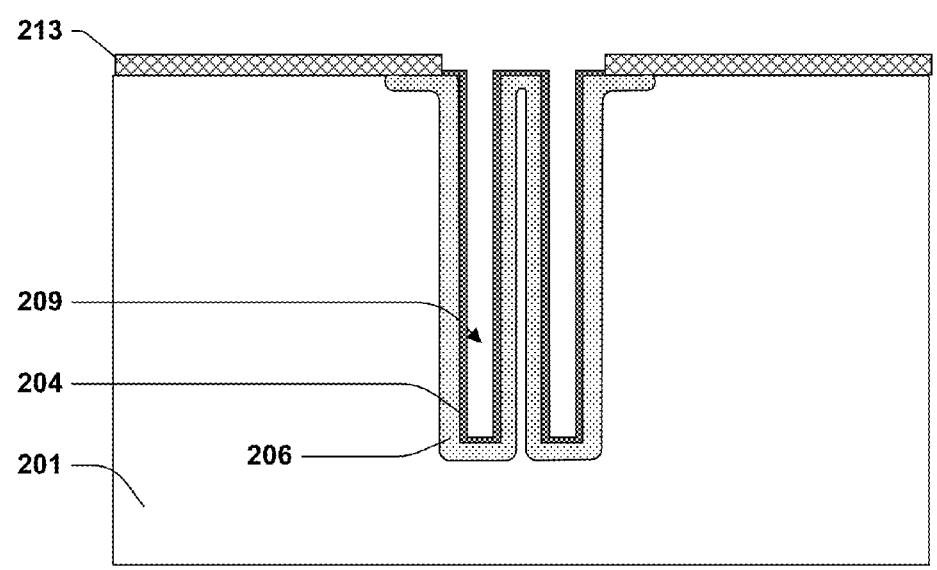
FIG. 8B illustrates the structure of FIG. 7 after diffusion doping according to one or more embodiments.

Operation 115 in FIG. 2 is doping the semiconductor 201 in the vicinity of trenches 209 to form a doped region. The doped region can be n-type or p-type, and can be formed by any suitable doping process. In FIG. 8A, for example, this doped region takes the form of a conductive well 203, which can be formed by an ion implantation process. In other embodiments, such as shown in FIG. 8B, a diffusion doping process is used whereby a highly doped liner layer 204 is provided in the trenches 209, and then dopants are out-diffused from the highly doped liner layer 204 to form a doped surface region 206 in the semiconductor 201. In other examples, the semiconductor 201 can be doped with phosphorous by exposing the heated substrate 201 to $POCl_3$ vapor to form the doped region. In some embodiments, such as shown in FIG. 8A, the conductive well 203 extends to a depth greater than that of the trenches 209. To the extent that the trenches have a depth that may vary in some embodiments between 500 nm and 10,000 nm, the conductive well 203 has a depth greater than between 500 nm and 10,000 nm, respectively, in some embodiments. A width of the conductive well 203 will be dictated by the number of desired trenches, as may be appreciated. This doped region can act as a first capacitor electrode for the deep trench capacitor.

Figure 9:
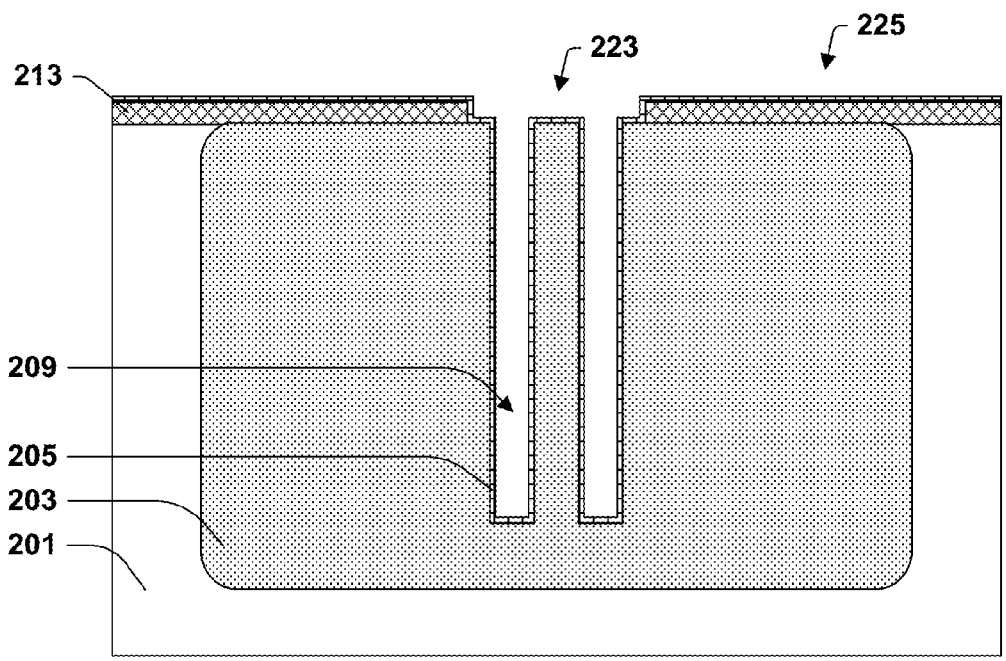

Operation 117 in FIG. 2 lines trenches 209 with a dielectric liner 205, as illustrated in FIG. 9 according to one or more embodiments. The liner 205 can be formed from one or more layers of any suitable dielectric(s). A typical structure for the liner 205 includes two or more layers. Typical materials for these layers include $SiO_2$, SiON, and SiN, and each of such layers may have a thickness of between 5 nm to 10 nm, in one embodiment. Other examples of material that can be used for the dielectric liner 205 include, without limitation, $Ta_2O$, $Al_2O_3$, and high-k dielectrics. The dielectric liner 205 can be formed by any suitable process or combination of processes. An initial operation can be deglazing to remove oxides formed on the sidewalls of the trenches 209 during prior processing. This dielectric liner 205 can act as a capacitive dielectric for the deep trench capacitor.

Figure 10:
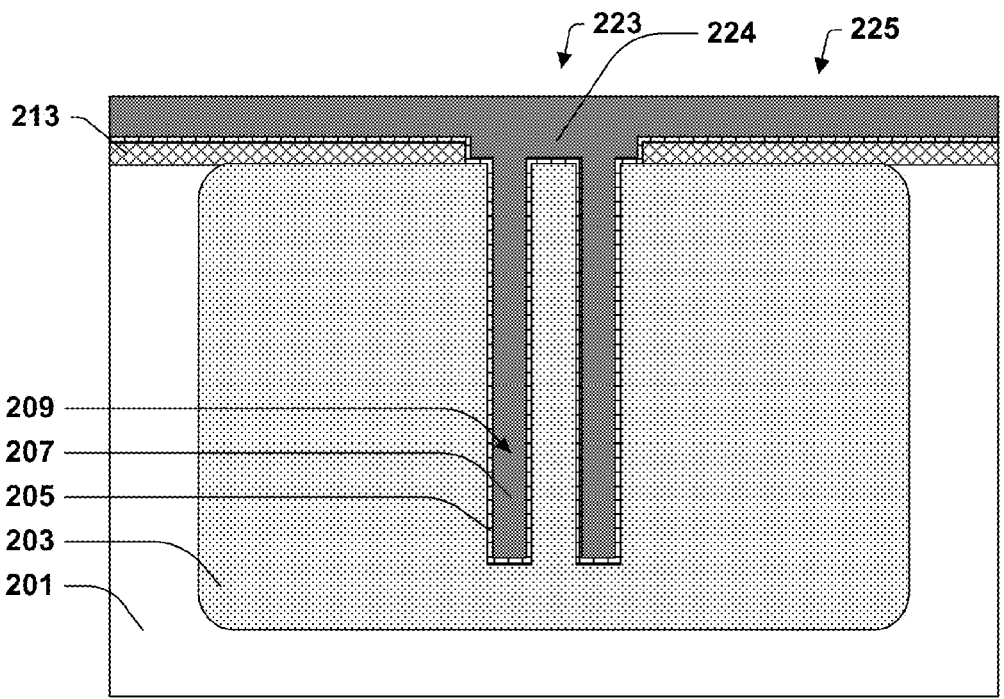

Operation 119 of FIG. 1 is depositing conductive material. The conductive material fills the trenches 209. The conductive material fills openings in the hard mask layer 213, recesses in the hard mask layer 213 at location 223 where the hard mask layer 213 has not been completely removed, and overlays the hard mask layer 213 at locations 225. Operation 119 forms contact plates 224 in recesses or openings in the hard mask layer 213 as shown in FIG. 10 according to one or more embodiments. Operation 119a of process 150 in FIG. 2 is an example of operation 119 in which the conductive material includes polysilicon (polycrystalline silicon), such as doped polysilicon, with a sheet resistance ranging from approximately 10 ohm/square to approximately 30 ohm/square. In general, operation 119 can employ any suitable conductive material or combination of materials. Operation 119 can form multiple layers of various conductive materials. Examples of conductive materials that can be used include doped semiconductors, metals, and metallic compounds. Examples of metals that can be used in operation 119 include, without limitation, tungsten, titanium, tantalum, ruthenium, cobalt, copper, aluminum, lead, platinum, tin, silver, and gold. Examples of metallic compounds that can be used in operation 119 include, without limitation, tantalum nitride, titanium nitride, tungsten silicide, tungsten nitride, titanium nitride, tantalum nitride, ruthenium oxide, cobalt silicide, and nickel silicide. The conductive material can be deposited by any suitable process or combination of processes.

Figure 11:
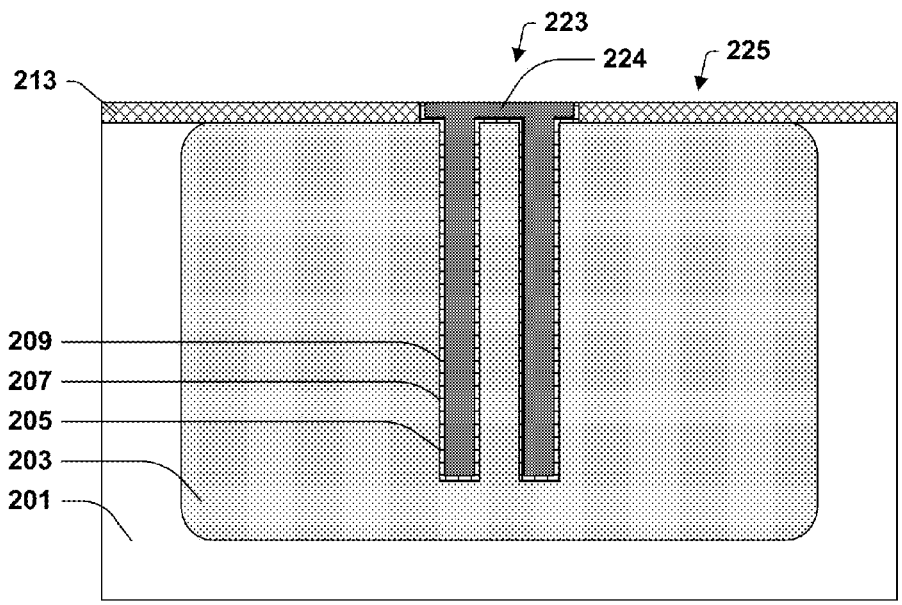

Operation 121 of FIG. 1 planarizes the surface of the substrate 200 to remove conductive material from region 225 while leaving conductive material in region 223 to form contact plate 224, which may also be referred to as a conductive body. FIG. 11 illustrates the substrate 200 after operation 121. Contact plate 224 can abut the surface of the semiconductor 201 as shown in FIG. 11 according to one or more embodiments. Alternatively, the contact plate 224 can be separated from the semiconductor 201 by a thinned remaining portion of the hard mask layer 213. While any suitable planarization process can be used, operation 121 is generally operation 121a of FIG. 2, which is chemical mechanical polishing. The portion of the hard mask layer 213 left by operation 113 can provide a stop layer for the planarization process, especially chemical mechanical polishing. In the above embodiment, the resultant thickness of the contact plate 224 is about that of the hard mask layer 213, for example, about 100 nm in one embodiment. This contact plate or conductive body can act as a second capacitor electrode for the deep trench capacitor.

Figure 12:
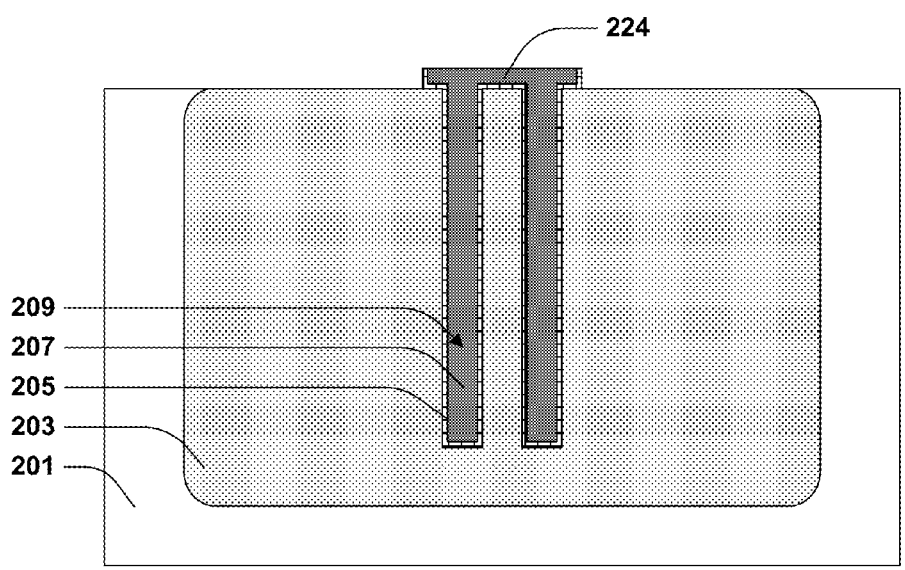

Operation 121 of the process 100 is generally followed by additional processing. Process 150 of FIG. 2 shows some additional operations that may be applied. After operation 121, the hard mask layer 213 has generally served its purpose. In process 150, operation 121 is followed by operation 123, removing the remaining portion of the hard mask layer 213. Completing removal of the hard mask layer 213 leaves contact plates 224 protruding from the surface of the substrate 200 as illustrated by FIG. 12 according to one or more embodiments. The hard mask layer 213 can be removed by any suitable process or combination of processes. A typical process is a wet process that oxidizes the material of the hard mask layer 213.

Figure 13:
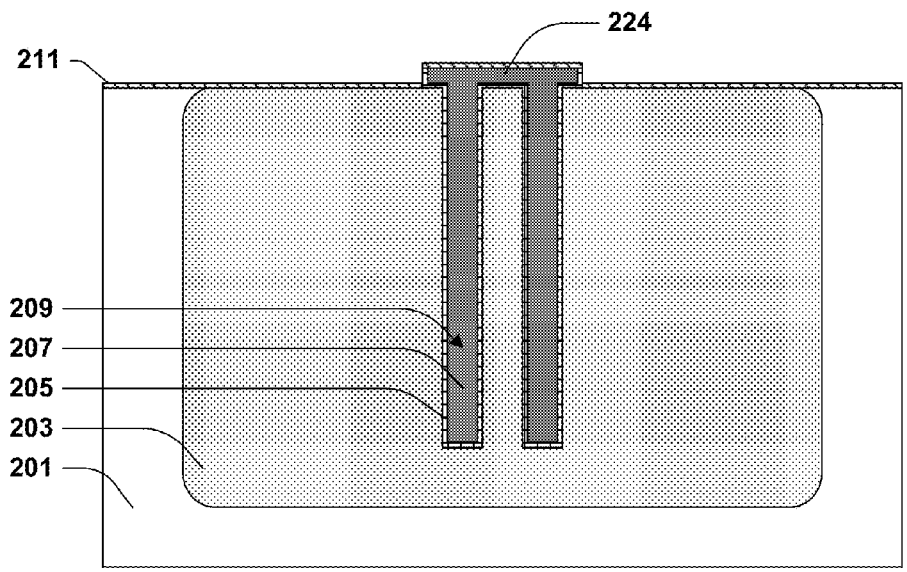

Operation 125 is a surface oxidation process that forms a dielectric oxide layer over the contact plate 224 and exposed surfaces of the semiconductor 201. The resulting structure is illustrated by FIG. 13 according to one or more embodiments. An advantage of using polysilicon or like material in operation 119 is that it allows the dielectric layer 211 to be formed over contact plate 224 by operation 125. The dielectric layer 211 may have a thickness of between 5 nm and 10 nm in one embodiment.

Figure 14:
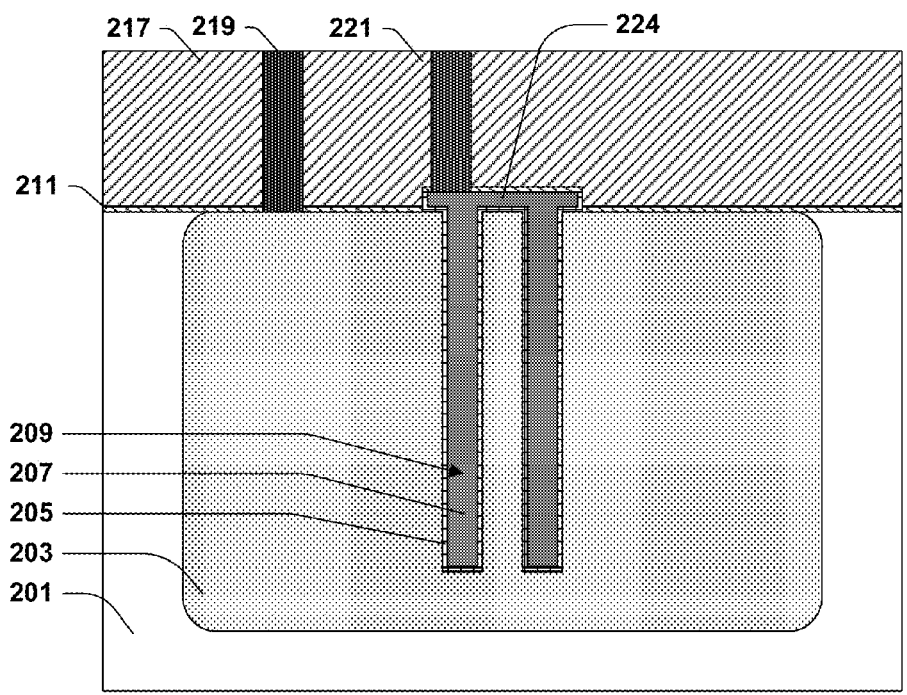

Operations 127 through 131 are some additional operations that can be used with process 100. Operation 127 forms an inter-level dielectric layer 217 over the substrate 200. Operation 129 etches contact vias through the inter-level dielectric layer 217 and dielectric oxide layer 211. Operation 131 fills the vias with metal to form contacts 219 and 221. The contact 219 forms an electrical connection with doped region 203. The contact 221 forms an electrical connection with contact plate 224. The resulting structure is illustrated by FIG. 14 according to one or more embodiments.

Thus, the embodiments described in FIGS. 2-14 provide a manufacturing process in which a hard mask layer is formed and patterned on a surface of a semiconductor substrate. Two or more parallel trenches are etched in the semiconductor substrate using the patterned hard mask as an etch mask. An etch process is then used to partially remove the patterned hard mask from the substrate surface. The process removes the hard mask layer between adjacent trenches while thinning but not removing the hard mask layer at other locations on the substrate surface. Conductive material is then deposited. The conductive material fills the trenches, the substrate between the trenches, and overlays at least a portion of the remaining hard mask layer. Chemical mechanical polishing removes the conductive material from areas where it overlays the remaining hard mask layer, but leaves conductive material overlaying the trenches and the substrate between adjacent trenches. The conductive material provides a conductive pathway between adjacent trenches.

These processes and methods allow one lithographic process to be used to define both a trench pattern and a pattern for a contact plate that overlays the trenches. Two masks are eliminated as compared to the prior art. In the prior art, the conductive material would be deposited over the substrate and a second mask used to reduce the conductive material to the contact plate pattern. The conductive material would cover alignment marks in the substrate. A third mask and etch would be required to expose the alignment marks before the second mask could be patterned. Moreover, in the present disclosure the conductive material can be reduced to the contact plate pattern by chemical mechanical polishing using a hard mask as a stop layer.

This process is easier to control as compared to a masked etch process that would be used to pattern the conductive material in the prior art. The methods and processes of the present disclosure can provide reduced queue time, reduced complexity, and improved uniformity for the resulting structures.

FIGS. 15-23 illustrate another embodiment of a method for forming a deep trench capacitor structure. In particular, whereas the above process described with regards to FIGS. 2-14 mentions that a dielectric liner used for the capacitor dielectric can include one or more layers but illustrates only a single layer (FIG. 9, 205), FIGS. 15-23 explicitly show an example where the capacitor dielectric includes multiple layers.

Figure 15:
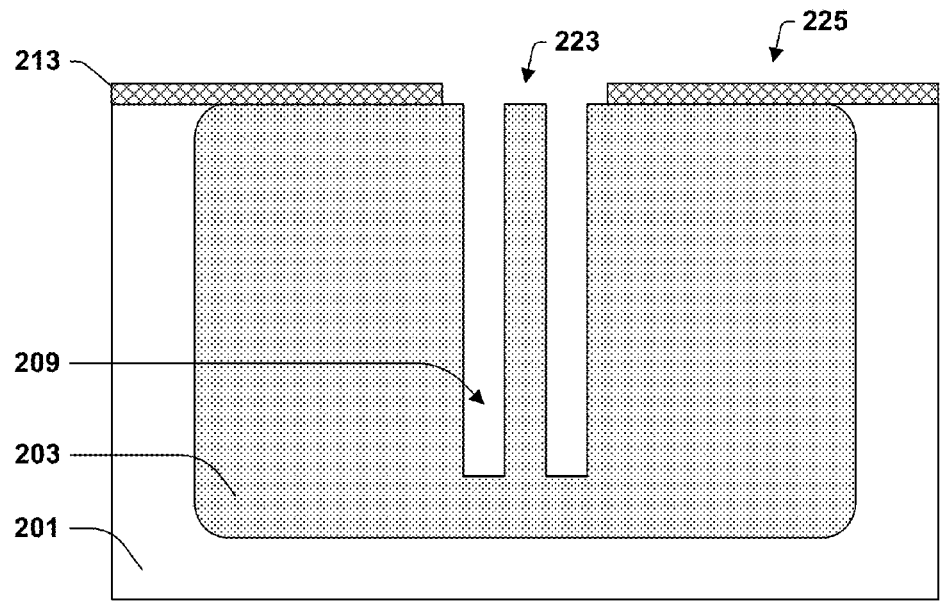
FIGS. 15-23 show another series of cross-sectional views that collectively illustrate a manufacturing process in accordance with some embodiments.

FIG. 15, which follows from previously described FIG. 6, shows a semiconductor substrate 200 that includes a doped region, such as well 203, formed therein. This doped region can act as a first (e.g., lower) capacitor electrode of the deep trench capacitor. Other doped regions as described above with regards to FIGS. 8A-8B could also be used in place of well 203. Two or more trenches 209 are formed within the doped region. A thinned hardmask layer 213 covers upper surface of substrate 200 at covered locations 225, and leaves the surface of substrate 200 exposed in other locations 223. Notably, as previously described and illustrated with regards to FIGS. 5-7, the process by which the trenches 229 and exposed area 223 are formed can eliminate one or more photo masks compared to conventional approaches.

Figure 16:
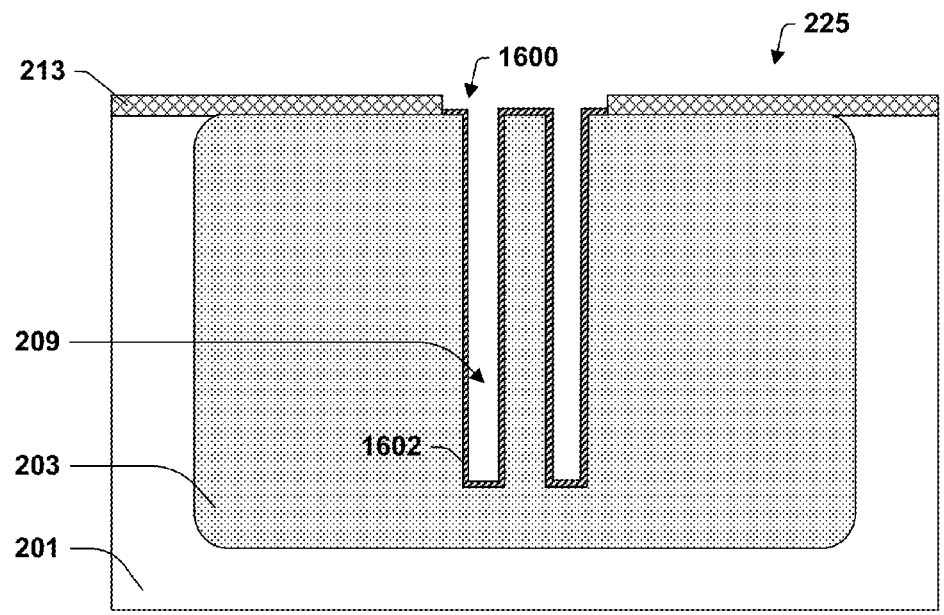
Figure 17:
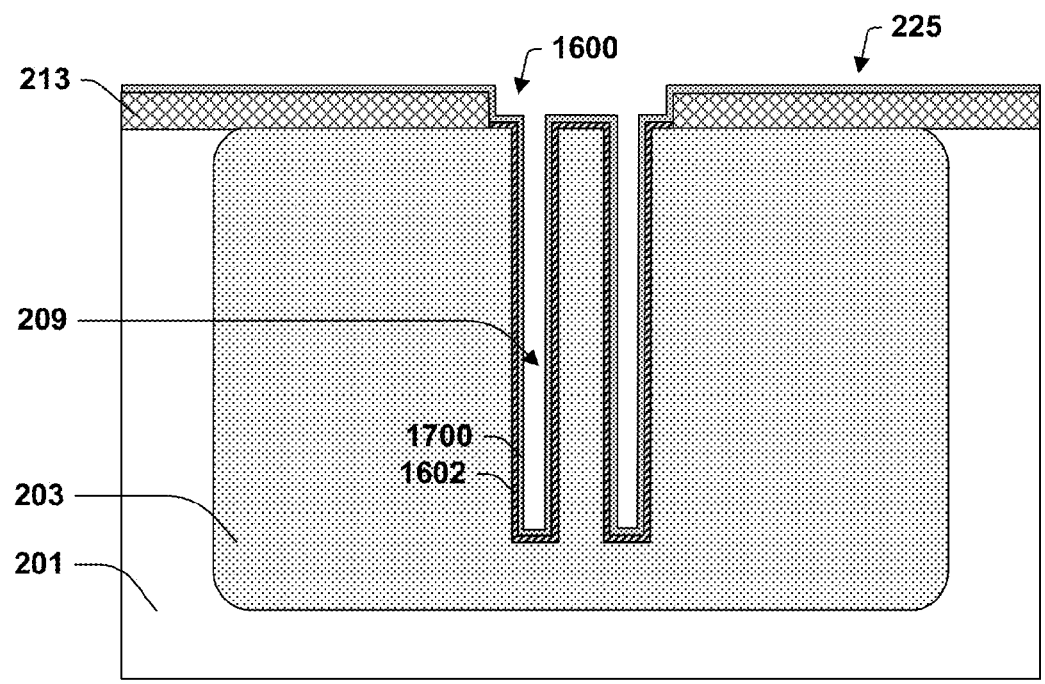
Figure 18:
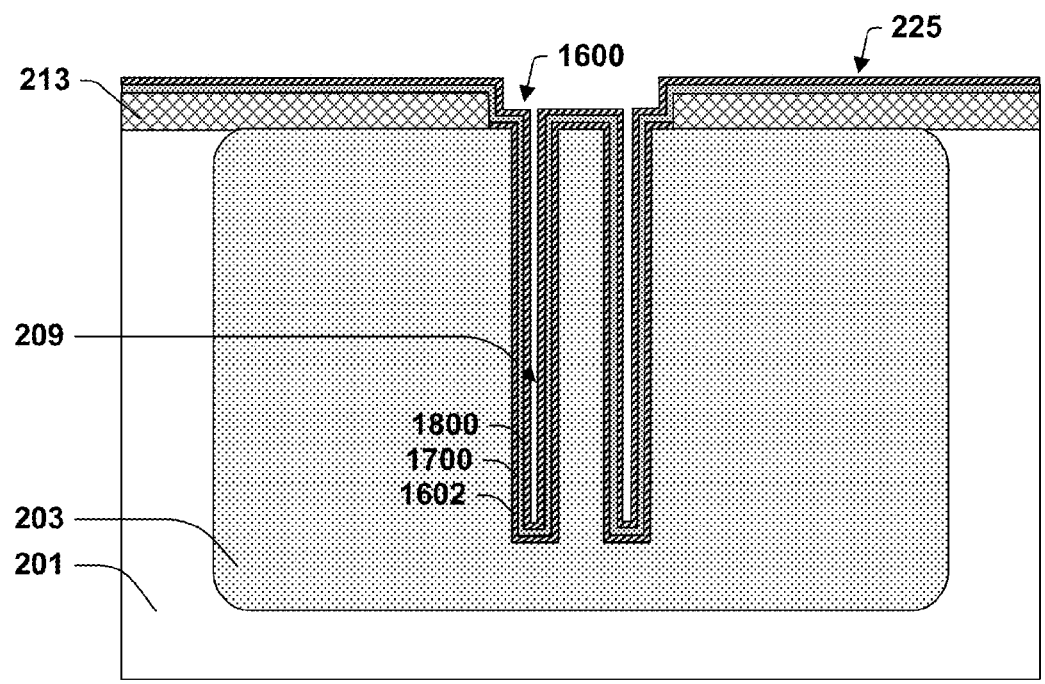

FIGS. 16-18 illustrate formation of capacitor dielectric liner 1600, which is made of three layers such as an oxide-nitride-oxide (ONO) structure, in the illustrated example. If present, the use of a tri-layer ONO dielectric structure provides a higher dielectric constant than a single SiO2 layer, given equal thicknesses, due to the fact that the dielectric constant of silicon nitride (approximately 7.5) is higher than the dielectric constant of pure SiO2 (approximately 3.9). The tri-layer ONO dielectric structure also tends to provide a higher breakdown voltage than a single SiO2 layer, and is therefore more robust.

In FIG. 16, a first conformal material 1602 lines the trench sidewalls and covers lower surfaces of two or more trenches 209. The first conformal material 1602 also extends out of the trenches 209 along the exposed upper surface of the substrate 200 without extending upward over the thinned hard mask layer 213. In some embodiments, the first conformal material 1602 is silicon dioxide ($SiO_2$), but in other embodiments, the first conformal material 1602 can be another dielectric, such as low-k dielectric, for example.

In FIG. 17, a second conformal material 1700, such as silicon nitride (Si3N4), is formed in the two or more trenches over the first conformal material 1602. The second conformal material 1700 extends out of the trenches 209 over the upper surface of the substrate 200 and extends upwards along sidewalls of the thinned hard mask layer 213.

In FIG. 18, a third conformal material 1800, such as $SiO_2$, is formed in the two or more trenches over the second conformal material. The third conformal material 1800 extends out of the trenches 209 over the upper surface of the substrate 200 and extends upwards along sidewalls of the thinned hard mask layer 213.

Figure 19:
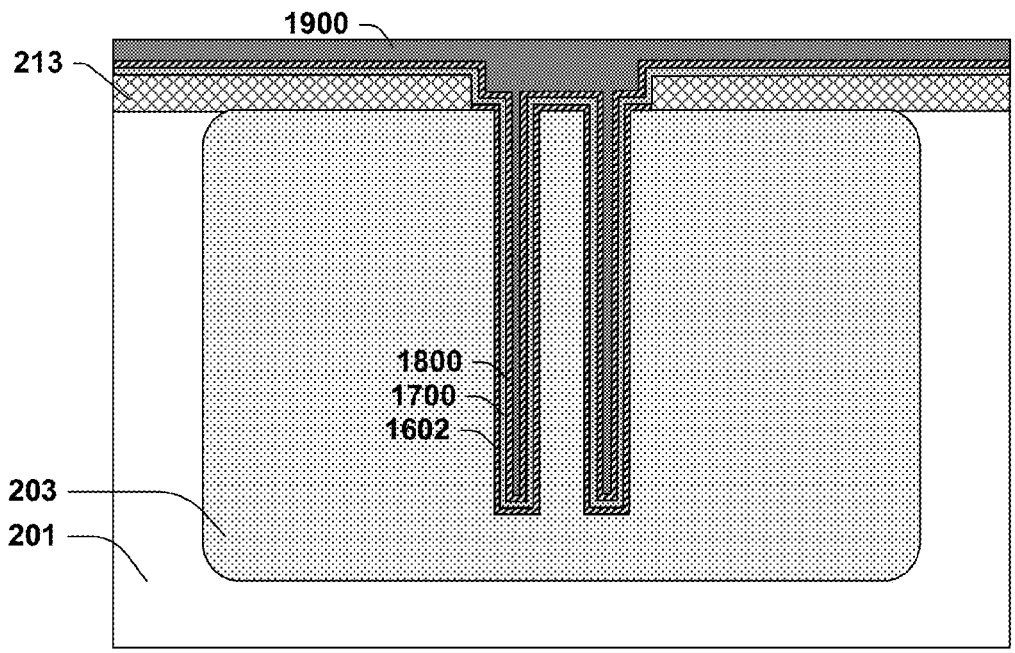

In FIG. 19, a conductive fill material 1900 is formed over the capacitor dielectric liner 1600. This conductive fill material 1900 can act as a second (e.g., upper) capacitor electrode of the deep trench capacitor. In some embodiments, the conductive fill material 1900 is formed in-situ to so the conductive fill material is continuous without any seams or native oxides residing therein. Although the conductive fill material 1900 is described in some embodiments as being conductive polysilicon, such as doped polysilicon, in other embodiments the conductive fill material can be a metal or metal alloy.

Figure 20:
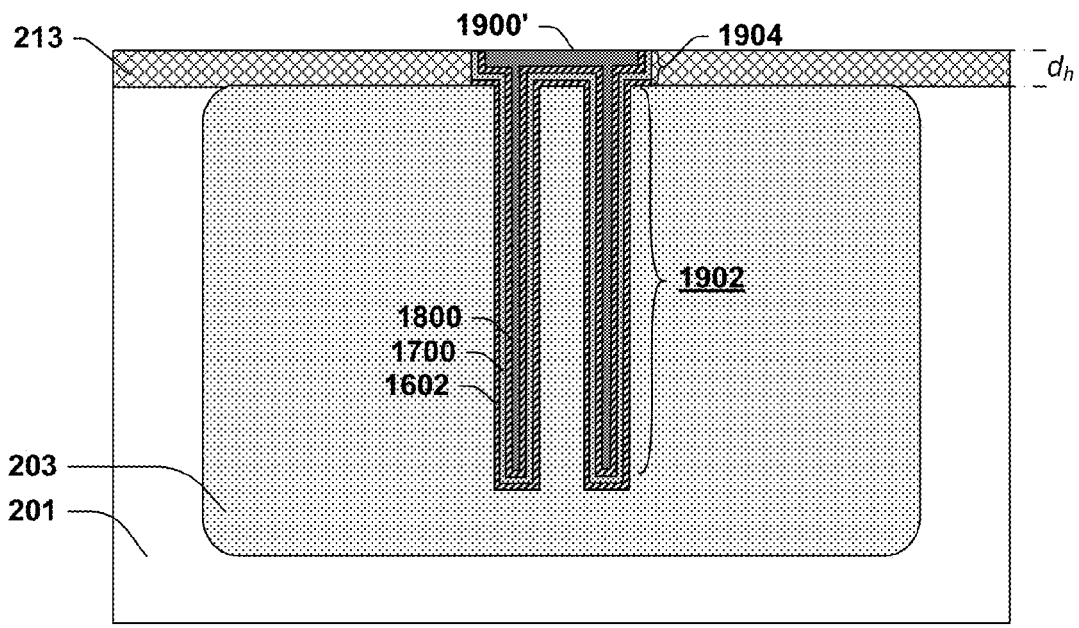

In FIG. 20, CMP is performed to planarize the top surface of the conductive fill material, thereby forming a continuous conductive body 1900'. The continuous body of conductive material has a lower body portion 1902 filling the two or more trenches and has an upper body portion 1904 extending continuously over the lower body portion. The upper body portion 1904 extends upwardly out of the trenches 209 by a non-zero distance, $d_h$, corresponding to the height of the thinned hard mask 213 at which CMP stops.

Figure 21:
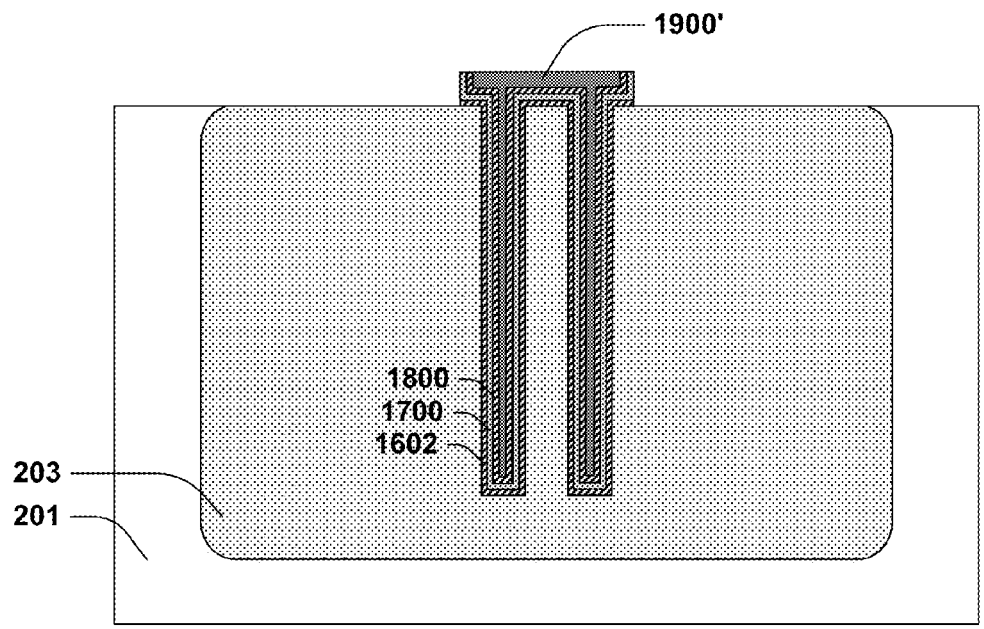

In FIG. 21, the thinned hardmask layer 213 is removed.

Figure 22:
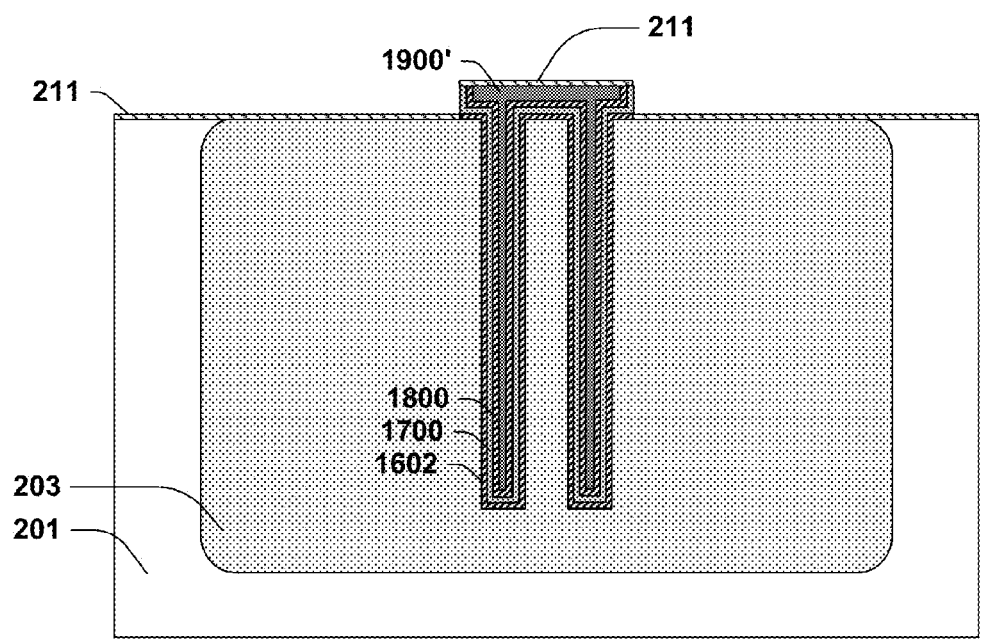

In FIG. 22, a surface oxidation process forms a dielectric oxide layer 211 over an upper surface of the continuous conductive body 1900' and over exposed surfaces of the semiconductor 201. An advantage of using polysilicon or like material for the continuous conductive body 1900' is that this allows the dielectric layer 211 to be formed thereover. The dielectric layer 211 may have a thickness of between 5 nm and 10 nm in one embodiment.

Figure 23:
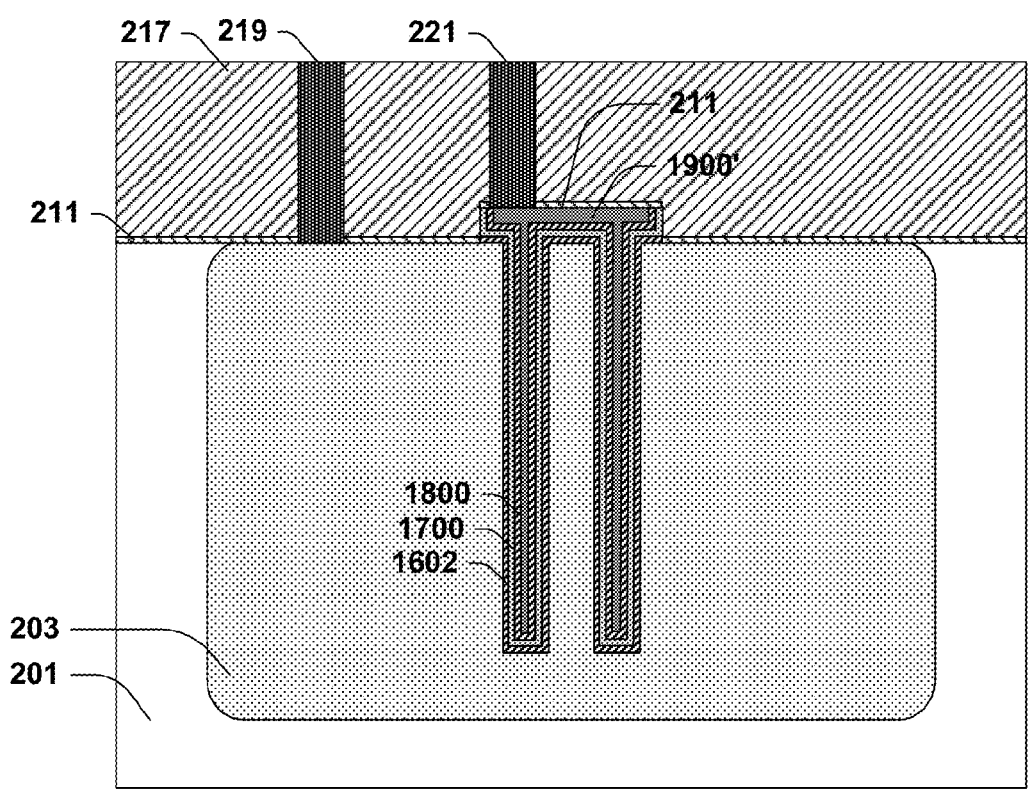

In FIG. 23, an inter-level dielectric layer 217 has been formed over the substrate 200. Contacts and/or vias have been formed through the inter-level dielectric layer 217 and dielectric oxide layer 211. For example, contact 219 forms an electrical connection with doped region, such as well 203. The contact 221 forms an electrical connection with continuous conductive body 1900'. Thus, contacts 219 and 221 represent first and second capacitor terminals for the deep trench capacitor structure.

Figure 24A:
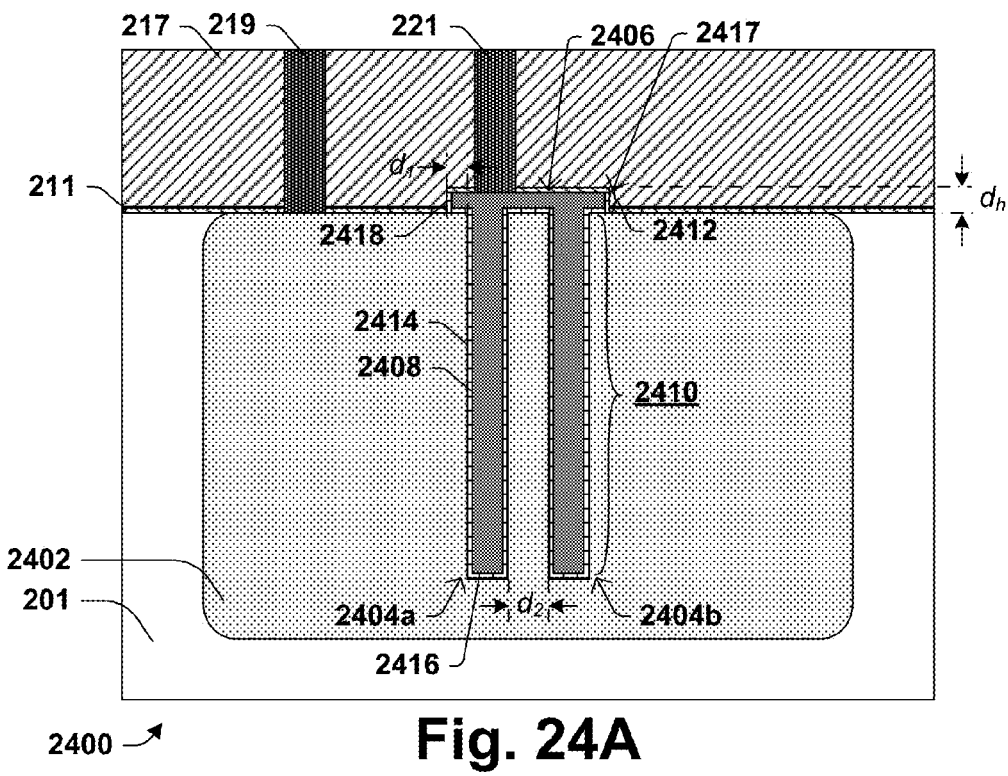
FIG. 24A illustrates a cross-sectional view of a capacitor structure in accordance with some embodiments.
Figure 24B:
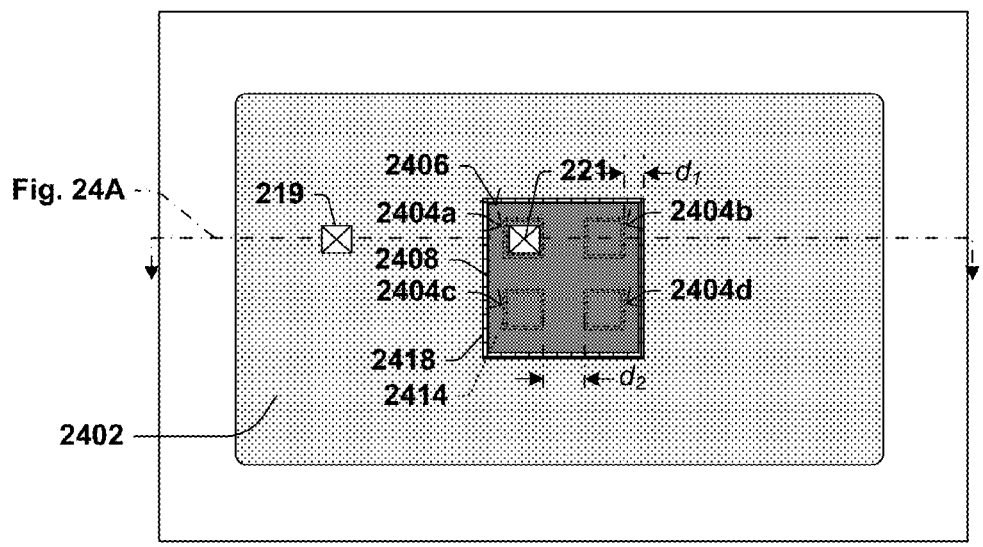
FIG. 24B illustrates a top view of the capacitor structure of FIG. 24A.

FIG. 24A and FIG. 24B show a cross-sectional view and top view, respectively, of deep trench capacitor 2400, such as formed by the manufacturing process of FIGS. 2-14. The deep trench capacitor has a first capacitor electrode 2402 corresponding to a doped region of semiconductor substrate. In this example, an array of four trenches 2404a-2404d, arranged in two rows and two columns, are arranged within the doped region 2402. A second capacitor electrode 2406, which comprises a continuous body of conductive material, is formed in the trenches. The second capacitor electrode 2406 is spaced apart from the first capacitor electrode 2402 by a capacitor dielectric liner 2408.

A lower body portion 2410 of the continuous body of conductive material fills the trenches 2404a-2404d, and an upper body portion 2412 of the continuous body of conductive material extends continuously over the lower body portion 2410. The upper body portion 2412 extends upwardly out of the trenches 2404a-2404d, by a non-zero distance, $d_h$. Within the trenches, the capacitor dielectric material 2408 lines the respective trench sidewalls 2114, and covers the respective trench lower surfaces 2416. Above the trenches, the capacitor dielectric material 2408 forms a band 2417 that is concentric around the upper body portion 2412. A first distance, $d_1$, separates an outer surface 2418 of the band 2417 from an outermost sidewall 2414 of the two or more trenches. The first distance, $d_1$, is less than or equal to a second distance, $d_2$, which separates neighboring sidewalls of the two or more trenches. In some embodiments, $d_1$ is approximately one-half of $d_2$ (equivalently, $d_2$ is approximately twice as large as $d_1$ in some embodiments). This structural relationship between the first and second distances $d_1$, $d_2$, evidences the streamlined manner in which the deep trench capacitor was formed and which saves mask operations compared to conventional approaches. Thus, deep trench capacitors with this structural relationship can exhibit lower cost of manufacture, while still providing good operating characteristics. In some embodiments, the first distance $d_1$ can be approximately 6 μm or less, and/or can be less than a thickness of a hard mask layer used to form the two or more trenches.

Figure 25A:
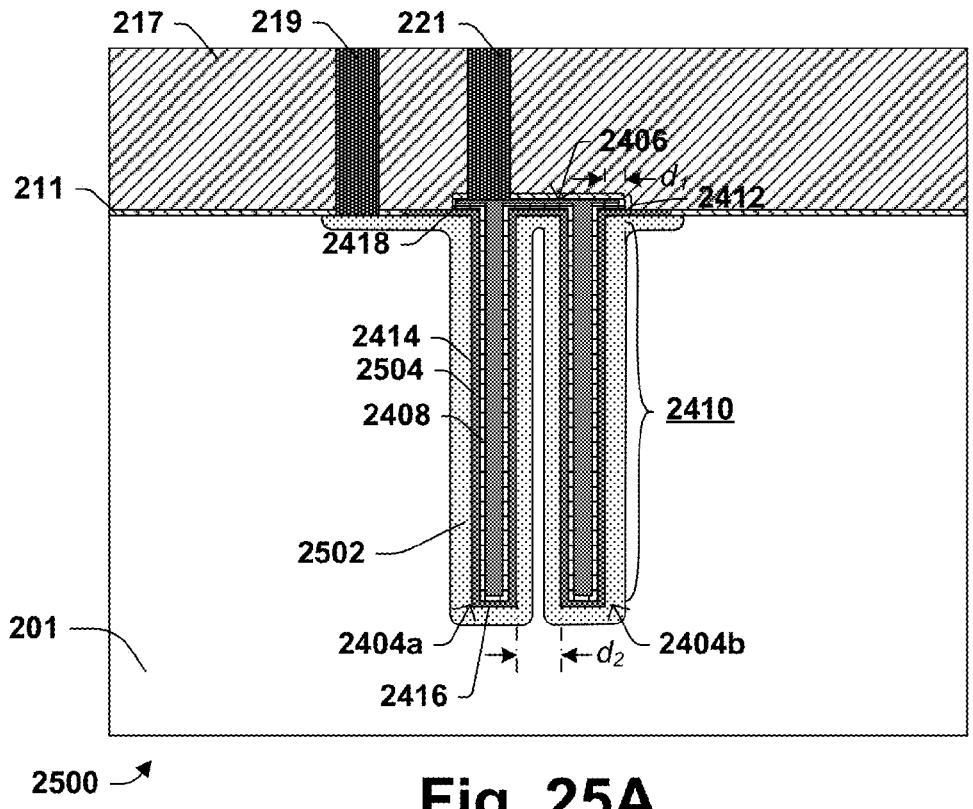
FIG. 25A illustrates a cross-sectional view of a capacitor structure in accordance with some embodiments.
Figure 25B:
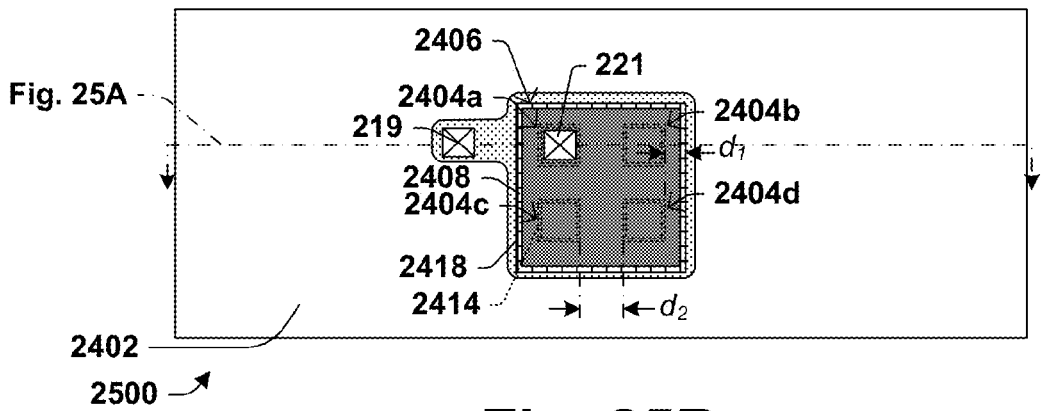
FIG. 25B illustrates a top view of the capacitor structure of FIG. 25A.

FIG. 25A and FIG. 25B show a cross-sectional view and top view, respectively, of another embodiment of a deep trench capacitor 2500, such as corresponds to a deep trench capacitor formed according to FIG. 8B. The deep trench capacitor 2500 differs from the deep trench capacitor 2400 in that the deep trench capacitor 2500 has a first (e.g., lower) electrode corresponding to a doped surface region 2502 rather than the well region shown in FIGS. 24A-24B. Thus, in some embodiments, an optional out-diffusion layer 2504 can reside within the trenches and can separate the doped region within semiconductor 201 from the capacitor dielectric 2408.

Figure 26A:
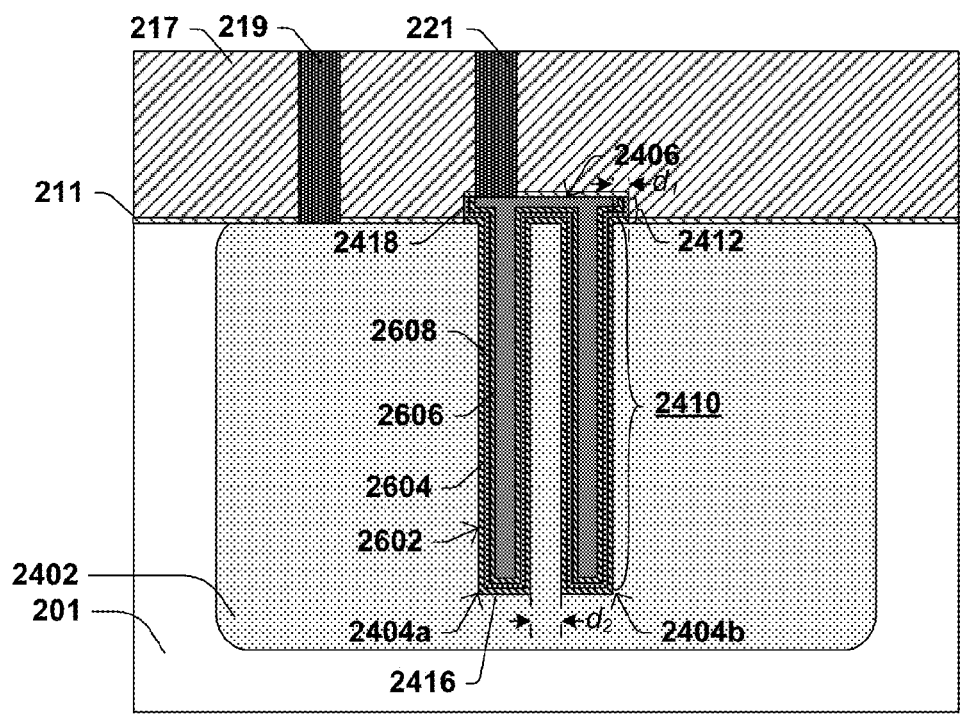
FIG. 26A illustrates a cross-sectional view of a capacitor structure in accordance with some embodiments.
Figure 26B:
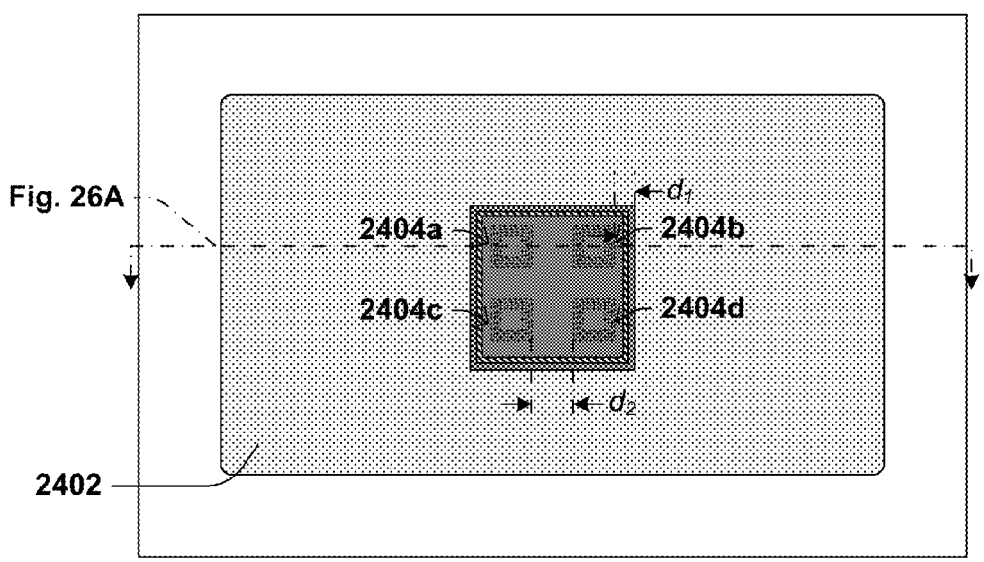
FIG. 26B illustrates a top view of the capacitor structure of FIG. 26A.

FIGS. 26A and FIG. 26B show a cross-sectional view and top view, respectively, of another embodiment of a deep trench capacitor 2600, such as formed by the manufacturing process of FIGS. 15-23. The deep trench capacitor 2600 has a capacitor dielectric liner 2602 made of three layers in the illustrated example. A first conformal oxide material 2604 lines the trench sidewalls and covers lower surfaces of the trenches. The first conformal oxide material 2604 also extends out of the trenches along the exposed upper surface of the substrate 200 without turning upward at its outermost edges. A second conformal oxide 2606 extends upwardly along outermost sidewalls of the upper portion of the continuous conductive body 2412 to form an inner band which is concentric about the upper body portion 2412. A nitride material 2608 extends upwardly along outermost sidewalls of the inner band to form an outer band which is concentric about the inner band.

Figure 27A:
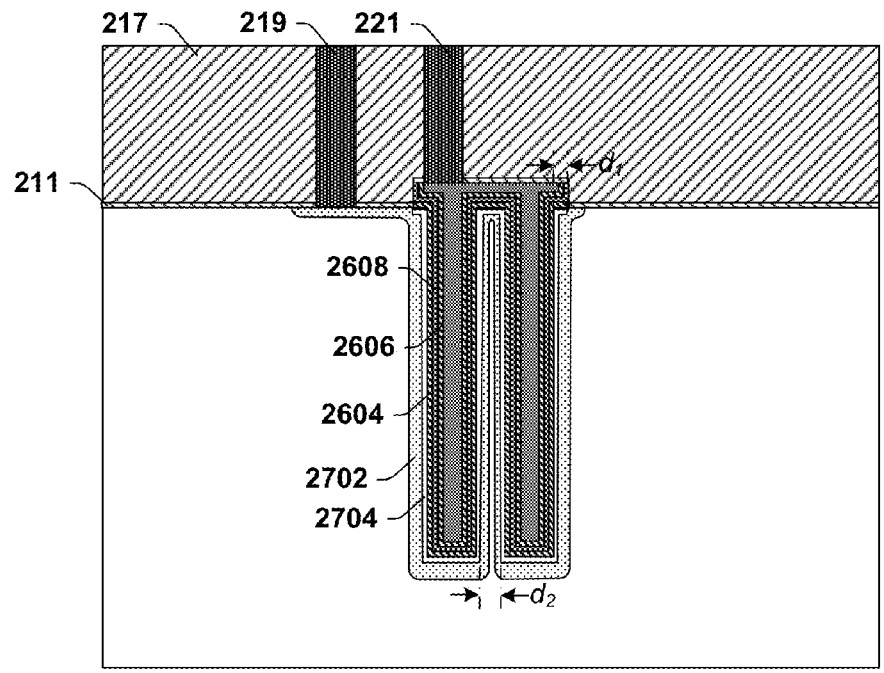
FIG. 27A illustrates a cross-sectional view of a capacitor structure in accordance with some embodiments.
Figure 27B:
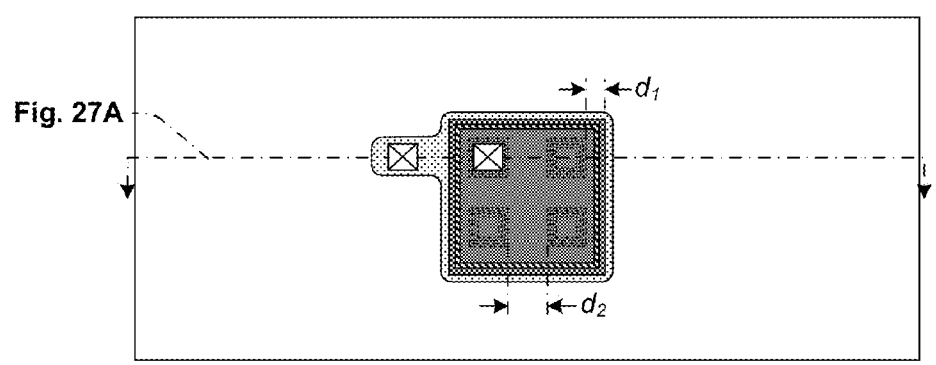
FIG. 27B illustrates a top view of the capacitor structure of FIG. 27A.

FIG. 27A and FIG. 27B show a cross-sectional view and top view, respectively, of another embodiment of a deep trench capacitor 2700. The deep trench capacitor 2700 differs from the deep trench capacitor 2600 in that the deep trench capacitor 2700 has a first (e.g., lower) electrode corresponding to a doped surface region 2702 rather than the well region 2402 shown in FIGS. 26A-26B. Thus, in some embodiments, an optional out-diffusion layer 2704 can reside within the trenches and can separate the doped surface region 2702 from the capacitor dielectric made up of 2604, 2606, 2608.

Figure 28A:
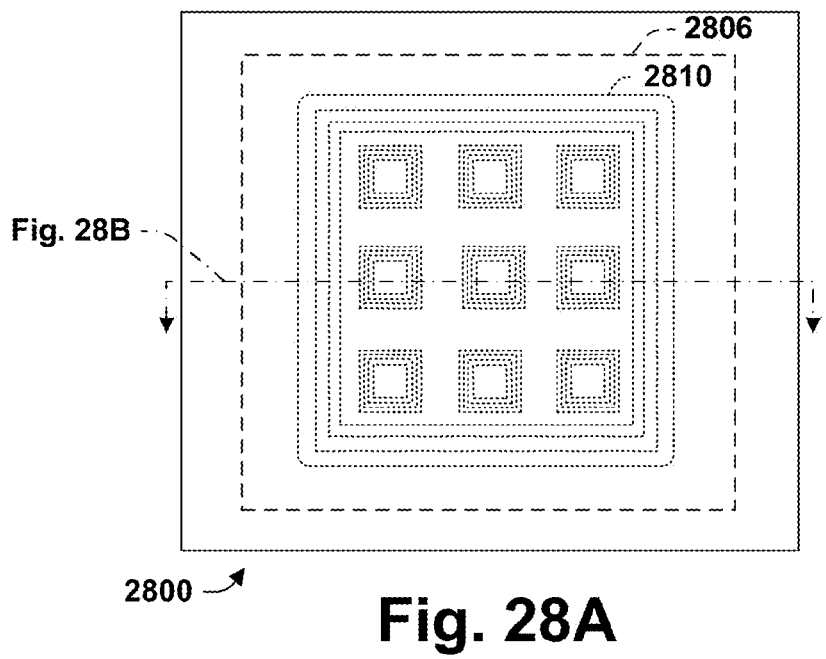
FIG. 28A illustrates a top view of a 3D IC package structure made up of two or more substrates in accordance with some embodiments.
Figure 28B:
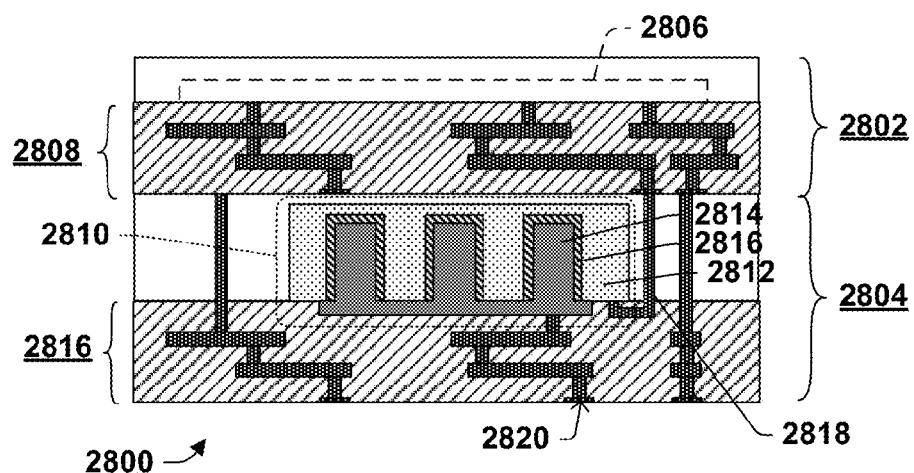
FIG. 28B illustrates a cross-sectional view of the 3D IC package structure of FIG. 28A.

FIGS. 28A and 28B show an embodiment of a so-called three-dimensional IC 2800 where multiple wafers are adhered or bonded together. FIG. 28A shows a top view of the 3D IC while FIG. 28B shows a cross-sectional view. As shown in FIG. 28B, the 3D IC is made up of first and second semiconductor substrates 2802, 2804, which are bonded or adhered together at the wafer level and then diced into individual dies or ICs.

The first semiconductor substrate 2802 includes semiconductor devices, such as a CMOS integrated circuit 280 on an active region thereof. In some embodiments, the CMOS integrated circuit can include a power-management IC, for example. The first semiconductor substrate 2802 also includes a first interconnect structure 2808, made of multiple alternating insulating and conducting layers through which the devices are accessible.

The second semiconductor substrate 2804 includes a deep trench capacitor structure 2810 as previously described, which includes a first capacitor electrode 2812 and a second capacitor electrode 2814 spaced apart by a capacitor dielectric 2816. The first capacitor electrode 2812 is made up of a doped region in the second semiconductor substrate, and the second capacitor electrode 2814 is made up of lower portions of a conductive body arranged in trenches and an upper portion of a conductive body extending thereover. The second semiconductor substrate also includes a second interconnect structure 2816, made of multiple alternating insulating and conducting layers through which the first and second capacitor electrodes are accessible.

One of the capacitor electrodes is coupled to the CMOS circuit 2806 by a first through silicon via 2818. In the illustrated embodiment of FIG. 28B, the first capacitor electrode is coupled to the CMOS circuit through the through-silicon via 2818, but in other embodiments the second capacitor electrode could alternatively be so coupled. The other capacitor electrode is coupled to an exposed surface of the second substrate, such as a bond pad, solder bump, or similar structure 2820. Thus, in this configuration the deep trench capacitor 2810 can act as a decoupling capacitor or another capacitor used for operation of the IC 2806. Notably, this configuration allows the array of trenches for the deep trench capacitor structure 2810 to be arranged directly under the IC 2806, which allows a particularly compact footprint for the resultant 3D IC.

Processes and methods provided by the present disclosure can be used to manufacture vertically structured devices such as deep trench capacitors. In particular, the processes and methods provide a streamlined approach to forming the capacitor trenches and an upper contact plate. A conductive well formed by diffusion doping of the substrate around the trenches can provide a second contact plate. The hard mask can be removed after planarizing and manufacturing completed using a previously established process flow.

Some embodiments relate to a deep trench capacitor device. A first capacitor electrode is made up of a doped region of semiconductor substrate in which two or more trenches are arranged. A second capacitor electrode is made up of a continuous body of conductive material. The continuous body of conductive material includes a lower body portion filling the two or more trenches and an upper body portion extending continuously over the lower body portion. The upper body portion extends upwardly out of the trenches by a non-zero distance. A capacitor dielectric liner is arranged in the two or more trenches to separate the first and second capacitor electrodes. The capacitor dielectric liner extends continuously out of the two or more trenches along outer sidewalls of the upper body portion.

Other embodiments relate to a deep trench capacitor device formed on a semiconductor substrate, which includes first and second trenches therein. A continuous body of conductive material has a lower body portion filling the first and second trenches. An upper body portion of the continuous body of conductive material extends upwardly out of the first and second trenches by a non-zero distance and extends continuously over the lower body portion. A conformal dielectric liner is arranged in the first and second trenches to separate the semiconductor substrate from the lower body portion and extends continuously out of the trench along outer sidewalls of the upper body portion.

Still other embodiments relate to an integrated circuit (IC) including a deep trench capacitor device. The deep trench capacitor includes a first capacitor electrode made up of a doped region of semiconductor substrate in which two or more trenches are arranged. A second capacitor electrode is made up of a continuous body of conductive material having a lower body portion and an upper body portion. The lower body portion fills the two or more trenches, and the upper body portion extends continuously over the lower body portion and extends out of the two or more trenches. A capacitor dielectric liner separates the first and second capacitor electrodes. The capacitor dielectric liner forms a band that is concentric around the upper body portion. An outer surface of the band extends outward beyond an outermost sidewall of the two or more trenches by a first distance. The first distance is less than or equal to a second distance which separates neighboring sidewalls of the two or more trenches.

The disclosure as delineated by the following claims has been shown and/or described in terms of certain concepts, components, and features. While a particular component or feature may have been disclosed herein with respect to only one of several concepts or examples or in both broad and narrow terms, the components or features in their broad or narrow conceptions may be combined with one or more other components or features in their broad or narrow conceptions wherein such a combination would be recognized as logical by one of ordinary skill in the art. Also, this one specification may describe more than one embodiment and the following claims do not necessarily encompass every concept, aspect, embodiment, or example described herein.

The invention claimed is:

1. An integrated circuit (IC) including a deep trench capacitor device, comprising:
   a first capacitor electrode comprising a doped region of semiconductor substrate in which two or more trenches are arranged;
   a second capacitor electrode comprising a continuous body of conductive material, wherein the continuous body of conductive material includes a lower body portion filling the two or more trenches and an upper body portion extending continuously over the lower body portion, wherein the upper body portion extends upwardly out of the trenches by a non-zero distance;
   a capacitor dielectric liner arranged in the two or more trenches to separate the first and second capacitor electrodes, wherein the capacitor dielectric liner extends continuously out of the two or more trenches along outer sidewalls of the upper body portion;
   wherein the capacitor dielectric liner comprises a first conformal oxide material lining respective trench sidewalls and covering respective trench lower surfaces of the respective two or more trenches, wherein the first conformal oxide extends out of the two or more trenches and extends over the semiconductor substrate without extending upwardly along the sidewalls of the continuous conductive body;
   a nitride material arranged in the two or more trenches and over the first conformal oxide material; and
   a second conformal oxide material arranged in the two or more trenches over the nitride material.

2. The IC of claim 1, the capacitor dielectric liner extends upwards along the outer sidewalls of the upper body portion and terminates at an upper surface of the continuous body.

3. The IC of claim 2, wherein the capacitor dielectric liner has an upper surface that is co-planar with the upper surface of the continuous body of conductive material.

4. The IC of claim 1, and wherein the second conformal oxide extends upwardly along outermost sidewalls of the continuous conductive body to form a conformal oxide band which is concentric about the upper body portion, and wherein the nitride material extends upwardly along outermost sidewalls of the conformal oxide band to form a nitride band which is concentric about the conformal oxide band.

5. The IC of claim 1, wherein the capacitor dielectric liner forms a capacitor dielectric band that is concentric around the upper body portion, wherein an outer surface of the capacitor dielectric band extends outward beyond an outermost sidewall of the two or more trenches by a first distance, and wherein the first distance is less than or equal to a second distance separating neighboring sidewalls of the two or more trenches.

6. The IC of claim 5, wherein the first distance is less than or equal to a thickness of a mask used to form the two or more trenches.

7. The IC of claim 1, wherein the trenches have a depth to width ratio of 10:1 or greater.

8. The IC of claim 1, further comprising:
   a doped layer comprising a first material arranged in the trenches separating the doped region of semiconductor substrate comprising a second material from the dielectric liner.

9. The IC of claim 1, wherein the second capacitor electrode is made of doped polysilicon.

10. The IC of claim 1, wherein the two or more trenches are a plurality of trenches arranged in multiple rows and multiple columns, wherein the upper body portion extends continuously over the multiple rows and multiple columns.

11. A deep trench capacitor device, comprising:
    a semiconductor substrate including first and second trenches arranged therein;
    a continuous body of conductive material having a lower body portion filling the first and second trenches and having an upper body portion extending upwardly out of the first and second trenches by a non-zero distance and extending continuously over the lower body portion;
    a conformal dielectric liner arranged in the first and second trenches to separate the semiconductor substrate from the lower body portion and extending continuously out of the trench along outer sidewalls of the upper body portion;
    wherein the conformal dielectric liner comprises a first conformal dielectric material lining respective trench sidewalls of the first and second trenches and covering respective trench lower surfaces of the respective first and second trenches, wherein the first conformal dielectric liner extends out of the first and second trenches and extends over the semiconductor substrate without extending upwardly along the sidewalls of the continuous body of conductive material;

a second conformal material arranged in the first and second trenches and over the first conformal dielectric material; and a third conformal dielectric material arranged in first and second trenches over the second conformal material.

12. The deep trench capacitor device of claim 11, and wherein the third conformal dielectric material extends upwardly along outermost sidewalls of the continuous conductive body to form an inner band which is concentric about the upper body portion, and wherein the second conformal material extends upwardly along outermost sidewalls of the inner band to form an outer band which is concentric about the inner band.

13. The deep trench capacitor device of claim 12, wherein the first and third conformal dielectric materials are made of silicon dioxide and wherein the second conformal material is a material other than silicon dioxide.

14. The deep trench capacitor device of claim 12, wherein the second conformal material is a nitride layer.

15. The IC of claim 11, wherein the conformal dielectric liner has an upper surface that is co-planar with the upper surface of the continuous body of conductive material.

16. The IC of claim 11, wherein the first and second trenches have a depth to width ratio of 10:1 or greater.

17. The IC of claim 11, wherein the continuous body of conductive material is made of doped polysilicon.

18. The IC of claim 11, wherein the conformal dielectric liner forms a capacitor dielectric band that is concentric around the upper body portion, wherein an outer surface of the capacitor dielectric band extends outward beyond an outermost sidewall of the first and second trenches by a first distance, and wherein the first distance is less than or equal to a second distance separating neighboring sidewalls of the first and second trenches.

19. An integrated circuit (IC) including a deep trench capacitor device, comprising:

a first capacitor electrode comprising a doped region of semiconductor substrate comprising a first material, wherein an array of four or more trenches arranged in two or more rows and two or more columns extend downward into the semiconductor substrate so the doped region lines sidewall surfaces of the trenches and lines an entire bottom surface of the trenches;

a second capacitor electrode comprising a continuous body of conductive material, wherein the continuous body of conductive material includes a lower body portion filling the array of four or more trenches and an upper body portion extending continuously over the lower body portion, wherein the upper body portion extends upwardly out of the trenches by a non-zero distance;

a capacitor dielectric liner arranged in the array of four or more trenches to separate the first and second capacitor electrodes, wherein the capacitor dielectric liner extends continuously out of the four or more trenches along outer sidewalls of the upper body portion; and a doped layer comprising a second material disposed in the array of four or more trenches between the capacitor dielectric liner and the doped region of semiconductor substrate, wherein in the array of four or more trenches the outermost sidewall of the doped layer is substantially aligned with the outermost sidewall of the dielectric liner;

wherein the capacitor dielectric liner comprises a first conformal oxide material lining respective trench sidewalls and covering respective trench lower surfaces of the respective two or more trenches, wherein the first conformal oxide extends out of the two or more trenches and extends over the semiconductor substrate without extending upwardly along the sidewalls of the continuous conductive body;

a nitride material arranged in the two or more trenches and over the first conformal oxide material; and a second conformal oxide material arranged in the two or more trenches over the nitride material.

* * * * *